United States Patent
Peil et al.

(10) Patent No.: US 10,185,112 B2
(45) Date of Patent: Jan. 22, 2019

(54) OPTICAL MODULE WITH DESIGN FEATURE FOR MOUNTING

(71) Applicant: Heraeus Noblelight GmbH, Hanau (DE)

(72) Inventors: Michael Peil, Otzberg (DE); Susanne Schadt, Langenselbold (DE); Harald Maiweg, Korschenbroich (DE); Marcus Helmling, Bad König (DE)

(73) Assignee: Heraeus Noblelight GmbH, Hanau (DE)

( * ) Notice: Subject to any disclaimer, the term of this patent is extended or adjusted under 35 U.S.C. 154(b) by 848 days.

(21) Appl. No.: 14/397,279

(22) PCT Filed: Mar. 21, 2013

(86) PCT No.: PCT/EP2013/000862
§ 371 (c)(1),
(2) Date: Oct. 27, 2014

(87) PCT Pub. No.: WO2013/164054
PCT Pub. Date: Nov. 7, 2013

(65) Prior Publication Data
US 2015/0075025 A1    Mar. 19, 2015

(30) Foreign Application Priority Data

May 2, 2012  (DE) .................. 10 2012 008 637

(51) Int. Cl.
*F26B 3/28*     (2006.01)
*G02B 7/00*    (2006.01)
(Continued)

(52) U.S. Cl.
CPC ............... *G02B 7/003* (2013.01); *F21K 9/20* (2016.08); *F21K 9/60* (2016.08); *F21K 9/69* (2016.08);
(Continued)

(58) Field of Classification Search
CPC . F02K 7/02; B82Y 5/00; B82Y 30/00; A61M 37/0092; B82B 1/006; F03G 7/005;
(Continued)

(56) References Cited

U.S. PATENT DOCUMENTS

| 5,660,461 A | 8/1997 | Ignatius et al. |
| 2011/0127564 A1 | 6/2011 | Preuss et al. |
| 2015/0048407 A1* | 2/2015 | Peil ............. F21K 9/00 257/98 |

FOREIGN PATENT DOCUMENTS

| DE | 202008002473 U1 | 4/2009 |
| DE | 102007063305 A1 | 7/2009 |

(Continued)

OTHER PUBLICATIONS

Office Action dated May 5, 2016 in CN Application No. 201380022954.6.

(Continued)

*Primary Examiner* — Jessica Yuen
(74) *Attorney, Agent, or Firm* — Panitch Schwarze Belisario & Nadel LLP

(57) ABSTRACT

An optical module is provided, including a substrate (1) of a defined shape, the substrate having two surfaces (1a, 1b) opposite from each other and an edge (1c). A layer (2) covers at least one of the surfaces (1a, 1b) of the substrate (1). The layer (2) includes a transparent polymeric material and has at least one optical element (3) which scatters rays of light originating from the substrate and passing through the optical element (3). A design feature for at least one of mounting and aligning (4, 5) the optical module is provided in a mounting region of the layer and is the same material and the same part as the layer (2).

17 Claims, 1 Drawing Sheet

(51) Int. Cl.
   *G02B 5/02* (2006.01)
   *H01L 33/58* (2010.01)
   *H01L 25/075* (2006.01)
   *F21V 5/00* (2018.01)
   *F21K 9/20* (2016.01)
   *F21K 9/60* (2016.01)
   *F21K 9/69* (2016.01)
   *H01L 33/54* (2010.01)
   *F21Y 105/00* (2016.01)
   *F21Y 115/10* (2016.01)

(52) U.S. Cl.
   CPC .................. *F21V 5/00* (2013.01); *F26B 3/28* (2013.01); *G02B 5/0268* (2013.01); *G02B 5/0278* (2013.01); *H01L 25/0753* (2013.01); *H01L 33/58* (2013.01); *F21Y 2105/00* (2013.01); *F21Y 2115/10* (2016.08); *H01L 33/54* (2013.01); *H01L 2924/0002* (2013.01); *H01L 2933/005* (2013.01)

(58) Field of Classification Search
   CPC . F26B 23/04; F26B 3/28; G02B 7/003; G02B 5/0268; G02B 5/0278; H01L 25/0753; H01L 33/58; H01L 2924/0002; H01L 33/54; H01L 2933/005; F21V 5/00; F21K 9/20; F21K 9/60; F21K 9/69; F21Y 2105/00; F21Y 2115/10
   See application file for complete search history.

(56) References Cited

FOREIGN PATENT DOCUMENTS

| | | |
|---|---|---|
| DE | 102008014927 A1 | 8/2009 |
| EP | 2317205 A1 | 5/2011 |
| EP | 2388139 A1 | 11/2011 |
| JP | 2000068671 A | 3/2000 |
| JP | 2007065511 A | 3/2007 |
| JP | 2008227385 A | 9/2008 |
| JP | 2011051107 A | 3/2011 |
| KR | 20110000374 U | 1/2011 |
| WO | 2008152575 A1 | 12/2008 |
| WO | 2009083476 A1 | 7/2009 |
| WO | 2011004326 A1 | 1/2011 |
| WO | 2012031703 A1 | 3/2012 |

OTHER PUBLICATIONS

Office Action dated Oct. 13, 2016 in CA Application No. 2,872,077.
Search Report (with English translation) and Office Action dated Aug. 28, 2015 in CN Application No. 201380022954.6.
Int'l Search Report and Written Opinion dated Jun. 25, 2013 in Int'l Application No. PCT/EP2013/000862.
Office Action dated Dec. 17, 2012 in DE Application No. 10 2012 008 637.7.
Office Action dated Dec. 7, 2015 in JP Application No. 2015509319.
Office Action dated Jul. 28, 2017 in DE Application No. 102012008637.

* cited by examiner

OPTICAL MODULE WITH DESIGN FEATURE FOR MOUNTING

CROSS-REFERENCE TO RELATED APPLICATIONS

This application is a Section 371 of International Application No. PCT/EP2013/000862, filed Mar. 21, 2013, which was published in the German language on Nov. 7, 2013, under International Publication No. WO 2013/164054 A1, the disclosure of which is incorporated herein by reference.

BACKGROUND OF THE INVENTION

The invention relates, generally, to an optical module, specifically comprising a substrate having a defined shape, wherein the substrate has two surfaces opposite from each other and an edge, and a layer that is applied to at least one of the surfaces to cover it. The layer consists of a transparent polymeric material and has at least one optical element which scatters rays of light that originate from the substrate and pass through the optical element.

International Patent Application Publication No. WO 2012/031703 A1 describes a production method for chip-on-board modules, in which a substrate comprises a plate-shaped carrier having multiple LEDs, wherein a surface of the substrate is provided, in an open casting mold, with a cover made up of a layer for providing an optical system.

BRIEF SUMMARY OF THE INVENTION

It is the object of the invention to devise an optical module that is easy to mount.

The object is solved according to the invention by an optical module, comprising a substrate of a defined shape, wherein the substrate has two surfaces opposite from each other and an edge, and a layer that is applied to at least one of the surfaces to cover it. The layer includes a transparent polymeric material and has at least one optical element which scatters rays of light that originate from the substrate and pass through the optical element. A design feature for mounting and/or aligning the optical module is provided in a peripheral region of the layer, being the same material and the same part as the layer.

An optical module in the scope of the invention shall be understood to be any component which either emits light actively or has a defined passive influence on a beam of light by scattering. In this context, the scattering proceeds, at least in part, by means of the optical element that is provided in the transparent layer. Preferred embodiments can have the optical element specifically be a lens, for example, a collecting lens, a dispersing lens, a cylinder lens, a Fresnel lens or the like. In other embodiments, the scattering by means of the optical element can alternatively consist of light scattering, diffraction by means of a prism or the like. The polymeric layer with the optical element formed therein forms an optical system that is arranged right on the substrate.

According to the scope of the invention, a design feature for mounting and/or aligning the module shall be understood to be any structuring of the layer which directly serves to affix the module, for example, by clamping the structure in a holder, or serves directly for positioning of the module.

In many cases, the substrate has a plate-shaped structure. This structure can have, for example, a rectangular, circular or polygonal circumference. In a plate-shaped structure of this type, the two surfaces extend parallel to each other. A plate-shaped structure with parallel surfaces is evident according to the scope of the invention also if a surface shows certain uneven places, for example, due to LEDs or other components applied to it.

In a generally preferred embodiment of the invention, the optical element and the design feature for mounting and/or aligning are formed in a casting process during the course of the application of the layer onto the substrate, thereby being the same material and the same part as the layer. A production of a layer of this type with an optical element in a casting process is described, for example, in WO 2012/031703 A1, reference to which shall thus be made. In this context, the additional design feature according to the invention can be made by modifying the casting mold appropriately. It is preferred that the casting proceeds by immersing the substrate into an open casting mold, as described in WO 2012/031703 A1.

In a preferred refinement of the invention, the layer consists of a silicone. This may include, in particular, highly pure silicone having high resistance to UV radiation. A highly pure silicone shall be understood to be a silicone that contains less than 1 part per thousand, in particular less than 10 ppm, of contaminations and foreign substances. This also includes carbon, which is not present in a highly pure silicone according to the scope of the invention.

In another embodiment of the invention, the design feature for mounting and/or aligning the module comprises at least one projection beyond a surface of the layer, having a clamping jaw of a holding device for the optical module placed on the projection. Projections of this type are easy means of providing good bracketing, having a defined contact surface. This allows accurate positioning to be attained and enables clamping without damage. The dimensioning of the projections can be matched to the material properties of the polymeric layer, such as hardness and elasticity. This can include, for example, nubs, beads or the like. The size of the individual design features can typically be in the range from 10 μm to approximately 1 mm for a module with lateral lengths on the order of magnitude of 1 cm to 100 cm.

If the module is clamped by means of the projections, these can be squeezed or elastically impressed in a defined manner by the clamping jaws.

In an alternative or additional embodiment, the design feature comprises a limit stop, positioned to attain dimensional stability in an aligning direction. This means, in particular, that the layer itself provides the defined reference points when the module is incorporated in a defined position. This advantageously means that the spatial positioning in the respective aligning direction proceeds in a defined manner with respect to the position of the optical element. The positioning of the substrate with respect to the layer can be within wider tolerances that are defined by the application on hand.

In an advantageous detailed design, the layer covers the edge of the substrate, and the aligning direction extends at least approximately parallel to the surfaces of the substrate. This allows for accurate positioning in a direction in space transverse to the emission direction, in which accurate positioning of the optical element often is particularly important. Advantageously, the accuracy of a position of the limit stop in the aligning direction is no more than 20 parts per thousand, preferably no more than 5 parts per thousand, of a dimension of the optical module in the aligning direction. If the material of the polymeric layer is relatively soft, it is advantageous to keep an eye on the contact forces during the mounting process in order not to falsify the limit stop position by compressing the layer. Combining a dimensionally stable limit stop and the manufacture of the module in an, in particular, open casting mold is particularly advantageous, since casting molds of this type can usually be made at high accuracy. Accordingly, the provision of a mold for the accurately positioned limit stop can easily be integrated into the design of the casting mold.

In another alternative or additional embodiment of the invention, the design feature for mounting and/or aligning is provided for notching, in a form-fitting manner at least in one direction, with a design feature of another optical module. This allows multiple modules to be joined directly in one or more directions in space. Due to the form-fit, a bracketing and/or at least relative positioning in at least one direction in space is provided. For example, modules that are arranged in series right next to each other in a longitudinal direction can comprise design features of the tongue-and-groove-type, which prevent at least a slipping with respect to each other in a transverse direction.

The design features can alternatively comprise a form-fitting notching in multiple directions in space, for example, pegs and receptacles analogous to the design of pieces of a puzzle. Depending on the requirements, this allows a serial or two-dimensional connection of immediately adjacent optical modules in a fixed position to be generated. The modules can, in particular, be structurally identical.

In generally preferred embodiments, the layer has a hardness in the range of 10 to 90 Shore A, preferably in the range of 50 to 75 Shore A. Due to this relatively low hardness, special polymers can be used as the medium forming the optical element, for example, highly pure silicones. The preferred hardness range is sufficient to provide for sufficiently accurate positioning and/or bracketing by means of the design features of the layer when needed. For example, in the case of a clamping-type bracketing on projections according to the invention, largely elastic deformation of the projections in the aforementioned hardness range may be evident. Altogether, this provides good protection against shocks, vibrations and/or mechanical tension, e.g., due to thermal expansions.

In one possible embodiment of the invention, the substrate comprises a chip-on-board module with a carrier and at least one LED that is arranged on the carrier. Such modules are described, for example, in WO 2012/031703 A1.

Advantageously, at least 50% of the light emitted by the LEDs is in a wavelength range below 470 nm. This allows the lamp to be designed as an UV emitter, at least mainly. Further combination of features according to the invention allows the UV emitter to be flexibly integrated into a technical device, for example, a printing machine.

Alternatively, at least 50% of the light emitted by the LEDs is in a wavelength range above 780 nm. This allows the lamp to be designed at least mainly as an IR emitter. Further combination of features according to the invention allows the IR emitter to be flexibly integrated into a technical device, for example, a printing machine.

In another embodiment, the substrate comprises an optically transparent or optically reflective carrier, and an optical system for specific scattering of rays of light is formed by the carrier and the layer acting in concert. Such optical systems are preferably manufactured in a similar manner as described in WO 2012/031703 A1, wherein the chip-on-board module is replaced by the optically transparent or reflective, i.e., optically effective, carrier. The carrier can alternatively be covered by a polymeric layer and optical elements on two sides that are opposite to each other.

Depending on the requirements, each of the layers can comprise a design feature according to the invention. A simple example of a carrier is a glass plate to which one or more optical elements, such as, e.g., lenses, are applied by means of the polymeric layer.

The object of the invention is also solved through an apparatus for drying a coating, comprising a lamp having an optical module according to the invention. The module according to the invention is particularly well-suited for a lamp and/or apparatus of this type, since it combines high irradiation intensities and a flexible and, in particular, compact design.

In a preferred refinement, a two-dimensional substrate bearing the coating to be dried and the lamp can be moved toward each other in a conveying direction, such that the lamp extends at least partly over a width of the substrate in a transverse direction and is arranged at a defined distance above the substrate. This shall include scanning of the substrate surface in multiple runs. The substrate can, for example, be a printed matter that is coated with lacquer or another substance being printed on it in a printing machine.

The object of the invention is also achieved through the use of an optical module according to the invention for drying a coating, preferably in a printing procedure.

Further advantages and features of the invention are evident from the exemplary embodiment described in the following as well as the dependent claims.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
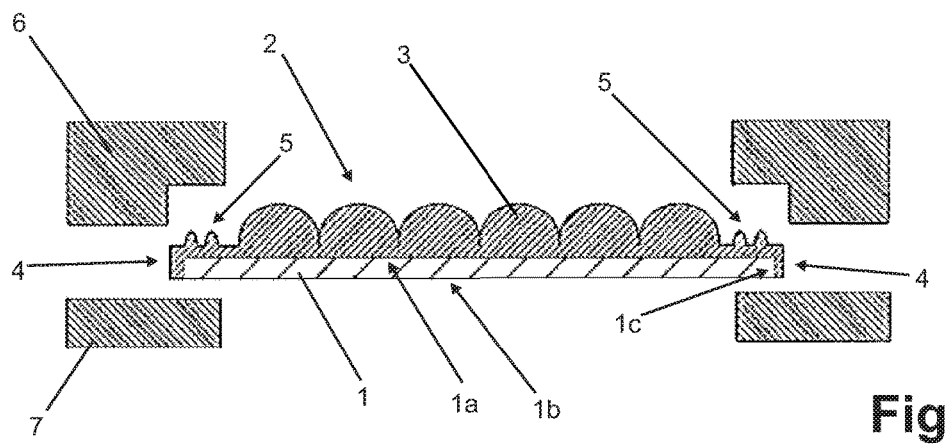
FIG. 1 is a schematic cross-sectional side view of an optical element according to an embodiment of the invention, in the process of being inserted into a bracketing.

The optical element shown in FIG. 1 comprises a plate-shaped substrate and/or a carrier 1 having two parallel surfaces 1a, 1b. Presently, the carrier has an edge 1c that is rectangular in shape. Shown only schematically, the carrier 1 is an LED module configured to bear a multiplicity of LEDs arranged in an array according to the modules described in WO 2012/031703 A1. The modules are also called chip-on-board modules and contain not only LEDs, but also connecting lines and, if applicable, further electronic components for triggering the LEDs.

The carrier 1 is provided with a layer 2 that consists of highly pure, UV-translucent and UV-resistant silicone. The layer covers one of the surfaces 1a. The LEDs are arranged on the surface 1a such that the surface 1a is only approximately even. However, in the scope of the invention, the two surfaces 1a, 1b are considered to be parallel.

The layer 2 is formed from the same material and in one piece and comprises a multiplicity of design features 3 that are provided as optical elements, i.e., as planar-convex focusing lens. The focusing lenses each are situated above an LED (not shown) in order to focus the emitted LED light and/or in order to transport the largest possible opening angle of the light.

The layer 2 also covers the edge 1*c* of the plate-shaped carrier 1 such that the layer 2 forms peripheral external surfaces 4 of the module. Concurrently with the external surfaces 4, accurately positioned limit stops are formed that enable forming a design feature for aligning the module at least in a transverse direction. The transverse direction extends in the horizontal line of the plane of the drawing of FIG. 1. The position of the limit stops and/or surfaces 4 in the transverse direction is defined at an accuracy of less than 10 parts per thousand of a diameter of the module in the transverse direction. This accuracy applies, in particular, to a position of the limit stops 4 with respect to the positions of the optical elements 3.

Accordingly, the limit stops 4 thus form design features for alignment and/or mounting in the scope of the invention.

Further design features according to the invention for aligning and/or mounting are formed by projections 5 that project in an upward direction beyond the surface of the layer 2. The projections are provided at the edge 1*c* above the surface 1*a* of the carrier 1. Depending on requirements, they comprise multiple individual nubs or fins.

In the illustrated embodiment, both design features 4, 5 are provided in a mounting region that is provided in the vicinity of the edge 1*c* of the carrier 1. However, in other embodiments, the mounting region may alternatively be arranged differently, for example, about a central bore hole or the like.

In the illustrated embodiment, the optical module is held in an apparatus by clamping via upper clamping jaws 6 and lower clamping jaws 7. In this context, the upper clamping jaws 6 do not press directly onto the free, planar surface of the layer 2, but rather press only on the projections 5. This generates a defined bracketing that can compensate well for mechanical tensions, for example, due to thermal expansion.

In the illustrated embodiment, one of the clamping jaws 6 defines the assembled position and/or the exact alignment of the module such that the corresponding limit stop surface 4 touches against a corresponding design feature of the clamping jaw 6 and/or bracketing. The lower clamping jaw 7 touches against the lower surface 1*b* of the carrier 1. However, in other embodiments, the lower surface 1*b* of the carrier 1 may alternatively be covered by a layer 2 and design features according to the invention can be present on that side as well.

Figure 2:
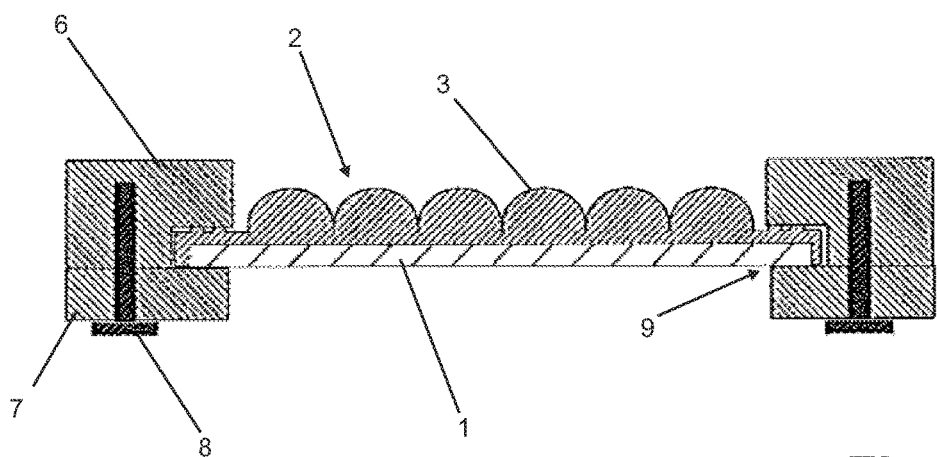
FIG. 2 is a schematic cross-sectional side view of the element from FIG. 1, fixed in position between clamping jaws.

In the mounted condition, as shown in FIG. 2, the clamping jaws 6, 7 touch against each other and are affixed by means of a screw 8. The width of a fastening gap 9 between the clamping jaws 6, 7, in which the module is accommodated, is pre-determined such that the module cannot be damaged by over-tightening a fastening member.

In the illustrated embodiment, the layer 2 consists of a silicone with a hardness of approximately 50 Shore A. Since this is a relatively soft material, clamping by means of the projections is particularly favorable as it prevents significant elastic deformation of the layer 2 and/or of the optical elements 3.

The manufacture of the module with the layer 2 on the carrier 1 proceeds essentially as described in WO 2012/031703 A1 by immersing the carrier 1 into an open casting mold that is filled with a silicone starting material. The low-viscosity starting material has a viscosity of less than 1,000 mPa·s, preferably of less than 100 mPa·s. In addition, design features according to the invention for aligning and/or mounting are provided on the casting mold.

In a further exemplary embodiment that is not shown, the carrier 1 can be coated on both sides, in particular by means of the method described above. In this context, the substrate can be provided, in particular, to be transparent, for example, in the form of a glass plate.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An optical module, comprising:
   a substrate (1) of a defined shape, the substrate having two surfaces (1*a*, 1*b*) opposite from each other and an edge (1*c*),
   a layer (2) covering at least one of the surfaces (1*a*, 1*b*), the layer (2) including a transparent polymeric material and at least one optical element (3) which scatters rays of light originating from the substrate and passing through the optical element (3), and
   a design feature (4, 5) for at least one of mounting and aligning the optical module, the design feature being a same material and a same part as the layer (2) and being located in a mounting region of the layer,
   wherein the design feature comprises a plurality of projections (5) formed at opposing ends of the optical module and projecting in an upward direction beyond a surface of the layer (2), and a clamping jaw (6, 7) of a holding device for the optical module, the clamping jaw (6, 7) being located on the plurality of projections (5).

2. The optical module according to claim 1, wherein the optical element (3) and the design feature (4, 5) are formed in a casting process during application of the layer (2) onto the substrate.

3. The optical module according to claim 2, wherein the casting process includes immersing the substrate into an open casting mold.

4. The optical module according to claim 2, wherein the layer (2) includes a silicone.

5. The optical module according to claim 1, wherein the design feature comprises a positioning limit stop (4) to attain dimensional stability in an aligning direction.

6. The optical module according to claim 5, wherein the layer (2) forms the limit stop (4) at a covering of the edge (1*c*) of the substrate, and the aligning direction extends at least approximately parallel to the surfaces of the substrate.

7. The optical module according to claim 5, wherein accuracy of a position of the limit stop (4) in the aligning direction is no more than 20 parts per thousand of a dimension of the optical module in the aligning direction.

8. The optical module according to claim 1, wherein the design feature is provided in a form-fitting manner in at least one direction, for notching with a design feature of another optical module.

9. The optical module according to claim 1, wherein the layer has a hardness in a range of 10 to 90 Shore A.

10. The optical module according to claim 1, wherein the substrate comprises a chip-on-board module including a carrier (1) and at least one LED arranged on the carrier (1).

11. The optical module according to claim 10, wherein the substrate comprises an optically transparent or optically reflective carrier (1), and wherein an optical system for specific scattering of rays of light is formed by the carrier (1) and the layer (2) acting in concert.

12. A device for drying a coating, comprising a lamp having an optical module according to claim 1.

13. The device according to claim 12, wherein a two-dimensional substrate bearing the lamp and the coating to be dried are movable toward each other in a conveying direction, such that the lamp extends at least partly over a width of the substrate in a transverse direction and is arranged at a defined distance above the substrate.

14. A method of drying a coating, using an optical module according to claim 1.

15. The method of claim 14, wherein the drying step is part of a printing procedure.

16. The optical module according to claim 1, wherein the projections (5) are in the form of nubs or fins.

17. The optical module according to claim 1, wherein the clamping jaw (6, 7) presses only on the plurality of projections (5) and not on the surface of the layer (2).

\* \* \* \* \*